(12) United States Patent
Petchsang et al.

(10) Patent No.: US 9,355,845 B2
(45) Date of Patent: May 31, 2016

(54) LIGHT INDUCED NANOWIRE ASSEMBLY

(71) Applicants: Nattasamon Petchsang, Nonthaburi (TH); Masaru Kuno, Granger, IN (US); Vladimir Plashnitsa, Mishawaka, IN (US)

(72) Inventors: Nattasamon Petchsang, Nonthaburi (TH); Masaru Kuno, Granger, IN (US); Vladimir Plashnitsa, Mishawaka, IN (US)

(73) Assignee: University of Notre Dame du Lac, Notre Dame, IN (US)

(*) Notice: Subject to any disclaimer, the term of this patent is extended or adjusted under 35 U.S.C. 154(b) by 0 days.

(21) Appl. No.: 14/216,452

(22) Filed: Mar. 17, 2014

(65) Prior Publication Data
US 2014/0273403 A1    Sep. 18, 2014

Related U.S. Application Data

(60) Provisional application No. 61/852,293, filed on Mar. 15, 2013.

(51) Int. Cl.
| | |
|---|---|
| *H01L 21/02* | (2006.01) |
| *C30B 29/46* | (2006.01) |
| *C30B 29/48* | (2006.01) |
| *C30B 29/60* | (2006.01) |
| *C30B 7/14* | (2006.01) |
| *C30B 29/06* | (2006.01) |
| *C30B 29/08* | (2006.01) |
| *C30B 29/16* | (2006.01) |
| *C30B 29/40* | (2006.01) |
| *C30B 29/50* | (2006.01) |
| *C30B 33/04* | (2006.01) |
| *B82Y 40/00* | (2011.01) |

(52) U.S. Cl.
CPC ............ *H01L 21/02628* (2013.01); *C30B 7/14* (2013.01); *C30B 29/06* (2013.01); *C30B 29/08* (2013.01); *C30B 29/16* (2013.01); *C30B 29/40* (2013.01); *C30B 29/46* (2013.01); *C30B 29/48* (2013.01); *C30B 29/50* (2013.01); *C30B 29/60* (2013.01); *C30B 33/04* (2013.01); *H01L 21/02521* (2013.01); *H01L 21/02551* (2013.01); *H01L 21/02568* (2013.01); *H01L 21/02601* (2013.01); *H01L 21/02603* (2013.01); *B82Y 40/00* (2013.01)

(58) Field of Classification Search
None
See application file for complete search history.

(56) References Cited

U.S. PATENT DOCUMENTS

| | | |
|---|---|---|
| 7,881,577 B1 | 2/2011 | Slack et al. |
| 8,066,967 B2 * | 11/2011 | Eberlein et al. ............... 423/461 |

(Continued)

OTHER PUBLICATIONS

Light Induced Nanowire Assembly: The Electrostatic Alignment of Semiconductor Nanowires into Functional Macroscopic Yarns, Petchsang, N. et. al., Advanced Materials., vol. 25, Issue 4, p. 601-605.*

(Continued)

*Primary Examiner* — Charles Garber
*Assistant Examiner* — Alia Sabur
(74) *Attorney, Agent, or Firm* — Haukaas Fortius PLLC; Michael H. Haukaas

(57) ABSTRACT

The invention provides a method for assembling semiconducting nanowires, which method can include providing a mixture comprising a dielectric solvent and two or more semiconducting nanowires, wherein the semiconducting nanowires can be the same or different; exposing the mixture to an electrostatic charge under lighting conditions; and allowing macroscopic nanowire alignment to occur, wherein each nanowire is substantially oriented along the direction of the applied electric field.

13 Claims, 8 Drawing Sheets

(56) References Cited

U.S. PATENT DOCUMENTS

2008/0261043 A1 10/2008 Greiner et al.
2011/0223484 A1 9/2011 Korgel et al.

OTHER PUBLICATIONS

Light Induced Nanowire Assembly: The Electrostatic Alignment of Semiconductor Nanowires into Functional Macroscopic Yarns, Petchsang, N. et. al., Advanced Materials., vol. 25, Issue 4; Supporting Information.*
Zhou et al. CdSe nanowires with illumination-enhanced conductivity: Induced dipoles, dielectrophoretic assembly, and field-sensitive emission, J. Appl. Phys. 101, 073704, (2007).*
Holmberg et al., Electrostatic charging and manipulation of semiconducting nanowires, J. Mater. Res., col. 26, No. 17, Sep. 14, 2011, p. 2305-2310.*
Talapin et. al., Alignment, Electronic Properties, Doping, and On-Chip Growth of Colloidal PbSe Nanowires, J. Phys. Chem. C 2007, 111, 13244-13249.*
Y. Y Liu et al., Manipulation of nanoparticles and biomolecules by electric field and surface tension. Comput. Methods Appl. Mech. Engrg. 197 (2008) 2156-2172.*
Wang et al., Electrokinetic Assembly of Selenium and Silver Nanowires into Macroscopic Fibers, ACS Nano, vol. 4 No. 5 2607-2614 (2010).*
Myung et al. Large-Scale "Surface-Programmed Assembly of Pristine Vanadium Oxide Nanowire-Based Devices" Adv. Mater. 2005, 17, 2361-2364.*
Ruda et al., Principles of nanowire alignment in an electric field, J. Appl. Phys. 109, 064305 (2011).*
Ryan, K. et al., Electric-Field-Assisted Assembly of Perpendicularly Oriented Nanorod Superlattices, Nano Lett., vol. 6, No. 7, 1479-1482 (2006).*
Bashouti, M., "Alignment of colloidal CdS nanowires embedded in polymer nanofibers by electrospinning," Chemphyschem: a European journal of chemical physics and physical chemistry 7, 102-6 (2006).
Holmberg, V.C., "Electrostatic charging and manipulation of semiconductor nanowires," Journal of Materials Research 26, 2305-2310, Sep. 14, 2011.
Huang, Y., "Directed assembly of one-dimensional nanostructures into functional networks," Science 291, 630-3, Jan. 2, 2001.
Lee, S., "Magnetic alignment of ZnO nanowires for optoelectronic device applications," Applied Physics Letters 90, 133115 (2007), 4 pp.
Protasenko, V., "Spatial and intensity modulation of nanowire emission induced by mobile charges, " Journal of the American Chemical Society 129, 13160-71, Oct. 6, 2007.
Smith, P., "Electric-field assisted assembly and alignment of metallic nanowires," Applied Physics Letters 77, 1399, Aug. 28, 2000.
Tanase, M., "Magnetic Alignment of Fluorescent Nanowires," Nano Letters 1, 155-158, Mar. 14, 2001.
Tao, A., "Langmuir—Blodgett Silver Nanowire Monolayers for Molecular Sensing Using Surface-Enhanced Raman Spectroscopy," Nano Letters 3, 1229-1233, Aug. 2, 2003.
Theron, A., "Electrostatic field-assisted alignment of electrospun nanofibres," Nanotechnology 12, 384-390 (2001).
Yaman, M., "Arrays of indefinitely long uniform nanowires and nanotubes," Nature Materials 10, 494-501, Jun. 12, 2011.
Yu, G., "Large-area blown bubble films of aligned nanowires and carbon nanotubes," Nature nanotechnology 2, 372-7, May 27, 2007.
Yu, Y., "A CdSe Nanowire/Quantum Dot Hybrid Architecture for Improving Solar Cell Performance," Advanced Functional Materials 20, 1464-1472 (2010).
Zhou, R., "CdSe nanowires with illumination-enhanced conductivity: Induced dipoles, dielectrophoretic assembly, and field-sensitive emission," Journal of Applied Physics 101, 073704 (2007).

* cited by examiner

LIGHT INDUCED NANOWIRE ASSEMBLY

RELATED APPLICATIONS

This application claims priority under 35 U.S.C. §119(e) to U.S. Provisional Patent Application Nos. 61/852,293, filed Mar. 15, 2013, which is incorporated herein by reference.

GOVERNMENT SUPPORT

This invention was made with government support under CHE-0547784 awarded by the National Science Foundation. The government has certain rights in the invention.

BACKGROUND OF THE INVENTION

Semiconducting nanowires have received much attention due to their promise as building blocks of miniaturized electrical, nanofluidic and optical devices, including nanolasers, light emitting devices, and subwavelength optical waveguides. Current chemical nanowire synthesis procedures that yield nanowires with specific compositions and growth directions, when these materials are used in scientific, biomedical, and microelectronic applications, is greatly restricted due to a lack of methods to easily assemble nanowires into functional structures. Several nanowire assembly techniques have been established and are still being researched, including electrostatic interactions, Langmuir-Blodgett/dip-coating, magnetic field assembly, mechanically applied shear forces, and dielectrophoresis.

Electrospinning is a technique that employs electrostatic interactions and results in electrostatic forming of yarn. This technique requires that the nanowires are suspended in a polymer or polymer solution. Electrospinning also uses a large electric field at a high cost to draw the polymer through a nozzle. The result of the electrospinning is a mix of nanowires and polymer.

Accordingly, a need exists for a new and improved method of assembling and modifying semiconducting nanowire structures. These needs and others are met within the present disclosure, which overcomes the deficiencies of previously developed semiconducting nanowire assembly methods.

SUMMARY OF THE INVENTION

This disclosure relates to methods of assembling nanowires, and more specifically to methods of assembling nanowires using light induction.

One aspect of the invention relates to a method for assembling semiconducting nanowires, said method comprising: providing a mixture comprising a dielectric solvent and two or more semiconducting nanowires, wherein said semiconducting nanowires can be the same or different; exposing said mixture to an electrostatic charge under ambient light illumination; and allowing macroscopic nanowire alignment to occur, wherein each nanowire is substantially oriented along the direction of the applied electric field.

Another aspect of the invention relates to a method for assembling semiconducting nanowires into a film, said method comprising: providing a mixture comprising a dielectric solvent and two or more semiconducting nanowires, wherein said semiconducting nanowires can be the same or different; applying an electrostatic charge to a substrate; depositing said mixture on top of said substrate under lighting conditions; and allowing macroscopic nanowire alignment to occur, wherein each nanowire is substantially oriented along the direction of the applied electric field.

Another aspect of the invention relates to a method for assembling semiconducting nanowires into yarns, said method comprising: providing a mixture, wherein the mixture comprises a dielectric solvent and at least two semiconducting nanowires; loading said mixture into a conduit; applying an electrostatic charge to a substrate; depositing said mixture from said conduit on top of said charged substrate under lighting conditions; and pulling said conduit away from said substrate in a direction along the surface normal.

Another aspect of the invention relates to a method for assembling semiconducting nanowires into segmented yarns, said method comprising: providing more than one mixture, each mixture comprising a low dielectric solvent and at least two semiconducting nanowires; depositing said more than one mixture on top of a substrate, applying an electrostatic charge to said more than one mixture under lighting; and allowing each group of said at least two semiconducting nanowires to alligate into one yarn and form segmented yarns.

Another aspect of the invention relates to a method for assembling semiconducting nanowires into segmented yarns, said method comprising: providing more than one mixture, each said more than one mixture comprising a dielectric solvent and at least two semiconducting nanowires; depositing said more than one mixture on top of a Teflon substrate; applying an electrostatic charge to said substrate using a tissue or an electrostatic generator; introducing a conduit into one of said more than one mixtures and pulling up said conduit, wherein a first yarn of at least two semiconducting nanowires is formed; pulling away said conduit from said one of said more than one mixtures and placing the bottom of said first yarn of at least two semiconducting nanowires into a second of the other said more than one mixtures, wherein at least one yarn of at least two semiconducting nanowires is formed, and characterized by assembling nanowires using LINA (light induced nanowire assembly), said LINA comprising applying lighting conditions to said at least two semiconducting nanowires; and allowing said at least two semiconducting nanowires to alligate into said first yarn during said pulling away of said conduit from one of said more than one mixtures and said placing of the bottom of said first yarn of at least two semiconducting nanowires into said second of the other said more than one mixtures to form segmented yarns.

BRIEF DESCRIPTION OF THE DRAWINGS

The following drawings form part of the specification and are included to further demonstrate certain embodiments or various aspects of the invention. In some instances, embodiments of the invention can be best understood by referring to the accompanying drawings in combination with the detailed description presented herein. The description and accompanying drawings may highlight a certain specific example, or a certain aspect of the invention. However, one skilled in the art will understand that portions of the example or aspect may be used in combination with other examples or aspects of the invention.

DETAILED DESCRIPTION

Figure 1:
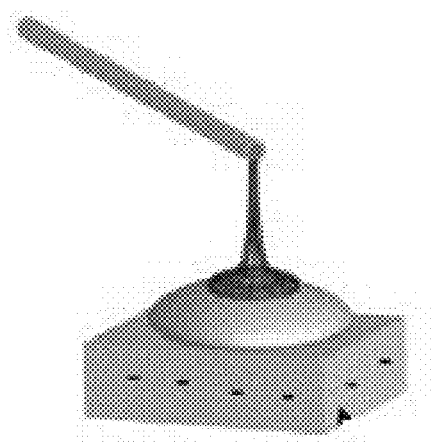
FIG. 1 shows an illustration of the manual yarn pulling process.

The current invention relates to electrostatic forming of yarn that does not use a large electric field, thereby reducing cost, and this process can form films and yarns from nanowires that does not require mixing nanowires and polymers.

One aspect of the invention relates to a method for assembling semiconducting nanowires, said method comprising: providing a mixture comprising a dielectric solvent and two or more semiconducting nanowires, wherein said semiconducting nanowires can be the same or different; exposing said mixture to an electrostatic charge under lighting conditions; and allowing macroscopic nanowire alignment to occur, wherein each nanowire is substantially oriented along the direction of the applied electric field. The lighting conditions that can be employed in this aspect of invention include, but is not limited to, to ambient light illumination, LED light, lamp light, and laser light. The lighting conditions can be broadband or monochromatic. In another embodiment of this method, the electrostatic charge is triboelectrically generated or applied externally.

In another embodiment of the method for assembling semiconducting nanowires, the nanowires are selected from zinc oxide, zinc sulfide, zinc selenide, zinc telluride, cadmium sulfide, cadmium selenide, cadmium telluride, mercury sulfide, mercury selenide, mercury telluride, germanium sulfide, germanium selenide, germanium telluride, tin sulfide, tin selenide, tin telluride, lead sulfide, lead selenide, lead telluride, and lead selenium sulfide, Si, Ge, GaP, GaAs, InP, InAs, or combinations thereof. In another embodiment of this method, the nanowire is selected from ZnO, ZnSe, CdS, CdSe, CdTe, PbS, PbSe or combinations thereof. In another embodiment of this method, the nanowire is selected from ZnO, ZnSe, Si, Ge, or combinations thereof.

In another embodiment of the method for assembling semiconducting nanowires, the electrostatic charge that can be applied ranges from about 10 V/cm to about 10,000 V/cm. In another embodiment, the electrostatic charge that can be applied ranges from about 10 V/cm to about 1,000 V/cm. In another embodiment, the electrostatic charge that can be applied ranges from about 10 V/cm to about 100 V/cm. In another embodiment, the electrostatic charge that can be applied ranges from about 10 V/cm to about 50 V/cm. In another embodiment, the electrostatic charge that can be applied ranges from about 10 V/cm to about 40 V/cm. In another embodiment, the electrostatic charge that can be applied ranges from about 10 V/cm to about 30 V/cm. In another embodiment, the electrostatic charge that can be applied is less than 40 V/cm.

In another embodiment of the method for assembling semiconducting nanowires, the nanowires are first washed to remove any excess ligand. In another embodiment, the nanowires are nanowire solutions that are at concentrations from about $10^{-13}$ to about $10^{-10}$ M. In another embodiment, the nanowires are nanowire solutions that are at concentrations from about $10^{-12}$ to about $10^{-11}$ M.

Another aspect of the invention relates to a method for assembling semiconducting nanowires into a film, said method comprising: providing a mixture comprising a dielectric solvent and two or more semiconducting nanowires, wherein said semiconducting nanowires can be the same or different; applying an electrostatic charge to a substrate; depositing said mixture on top of said substrate under lighting conditions; and allowing macroscopic nanowire alignment to occur, wherein each nanowire is substantially oriented along the direction of the applied electric field. The lighting conditions that can be employed in this aspect of invention include, but are not limited to, to ambient light illumination, LED light, lamp light, and laser light. The lighting conditions can be broadband or monochromatic. Another embodiment of this method further comprises evaporating said dielectric solvent, wherein said nanowires retains said alignment. In another embodiment of this method, the electrostatic charge is selected from (1) a unipolar charge of a positive sign applied to said substrate; or (2) a unipolar charge of a negative sign applied to said substrate.

In another embodiment of the method for assembling semiconducting nanowires into a film, the nanowires are selected from zinc oxide, zinc sulfide, zinc selenide, zinc telluride, cadmium sulfide, cadmium selenide, cadmium telluride, mercury sulfide, mercury selenide, mercury telluride, germanium sulfide, germanium selenide, germanium telluride, tin sulfide, tin selenide, tin telluride, lead sulfide, lead selenide, lead telluride, and lead selenium sulfide, Si, Ge, GaP, GaAs, InP, InAs, or combinations thereof. In another embodiment of this method, the nanowire is selected from ZnO, ZnSe, CdS, CdSe, CdTe, PbS, PbSe or combinations thereof. In another embodiment of this method, the nanowire is selected from ZnO, ZnSe, Si, Ge, or combinations thereof.

In another embodiment of the method for assembling semiconducting nanowires into a film, the substrate is selected from paper, alumina, silk, fur, lead, wool, nylon, hair, borosilicate, quartz, sapphire, leather, dry human skin, Teflon, silicon, PVC, polypropylene, polyethylene, polyurethane, polystyrene, polyester, gold, platinum, brass, silver, nickel, copper, hard rubber, amber, wood asbestos, mica, wool, wax, latex, neoprene, sulfur, acetate, acrylic, cellophane, polycarbonate, polyimide, polyethylene terephthalate, polyvinylidene chloride, polychlorotrifluoroethylene, polyvinylidene fluoride, polytetrafluoroethylene, indium-tin-oxide coated glass, or fluorinated tin oxide glass. In another embodiment, the substrate is selected from borosilicate, copper or Teflon.

In another embodiment of the method for assembling semiconducting nanowires into a film, the alignment area, which refers to aligned nanowires on a substrate, can be from about $10^{-6}$ m$^2$ to the size of any surface area that can be charged. In another embodiment, the size of the alignment area can be from about 1 square foot to about 100 square feet. In another embodiment, the size of the alignment area can be from about 10 square feet to about 50 square feet. In another embodiment, the size of the alignment area can be about 20 square feet.

In another embodiment of the method for assembling semiconducting nanowires into a film, the dielectric solvent is selected from hexane, toluene, benzene, carbon disulfide, carbon tetrachloride, cyclohexane, dibutyl ether, diethylamine, 1,4-dioxane, trichloroethylene, triethylamine, chlorobenzene, heptane, pentane, propanoic acid, m-xylene, o-xylene, p-xylene, octane, tetrahydrofuran, chloroform, dimethylformamide, or mixtures thereof. In another embodiment, the dielectric solvent is selected from pentane, hexane, heptane, octane, toluene, carbon tetrachloride, cyclohexane, tetrahydrofuran, chloroform, or mixtures thereof. In another embodiment, the dielectric solvent is hexane, toluene, or mixtures thereof.

In another embodiment of the method for assembling semiconducting nanowires into a film, the substrate is charged by rubbing its surface with a tissue or glove or by using an electrostatic generator to deposit charges onto the substrate. In another embodiment, the electrostatic generator is a van de Graaff electrostatic generator.

In another embodiment of the method for assembling semiconducting nanowires into film, the electrostatic charge that can be applied ranges from about 10 V/cm to about 10,000 V/cm. In another embodiment, the electrostatic charge that can be applied ranges from about 10 V/cm to about 1,000 V/cm. In another embodiment, the electrostatic charge that can be applied ranges from about 10 V/cm to about 100 V/cm. In another embodiment, the electrostatic charge that can be applied ranges from about 10 V/cm to about 50 V/cm. In another embodiment, the electrostatic charge that can be applied ranges from about 10 V/cm to about 40 V/cm. In another embodiment, the electrostatic charge that can be applied ranges from about 10 V/cm to about 30 V/cm. In another embodiment, the electrostatic charge that can be applied is less than 40 V/cm.

In another embodiment of the method for assembling semiconducting nanowires into a film, the nanowires are first washed to remove any excess ligand. In another embodiment, the nanowires are nanowire solutions that are at concentrations from about $10^{-13}$ to about $10^{-10}$ M. In another embodiment, the nanowires are nanowire solutions that are at concentrations from about $10^{-12}$ to about $10^{-11}$ M.

Another aspect of the invention relates to a method for assembling semiconducting nanowires into yarns, said method comprising: providing a mixture, wherein the mixture comprises a dielectric solvent and at least two semiconducting nanowires; loading said mixture into a conduit; applying an electrostatic charge to a substrate; depositing said mixture from said conduit on top of said charged substrate under lighting conditions; and pulling said conduit away from said substrate in a direction along the surface normal. The lighting conditions that can be employed in this aspect of invention include, but are not limited to, to ambient light illumination, LED light, lamp light, and laser light. The lighting conditions can be broadband or monochromatic.

In another embodiment of the method for assembling semiconducting nanowires into yarns, the conduit is pulled away from said substrate in a direction along the surface normal at a definite rate. In another embodiment, the conduit is a pipette or a syringe. In another embodiment, the conduit is a pipette made of glass (borosilicate for example).

In another embodiment of the method for assembling semiconducting nanowires into yarns, the pulling rate ranges from about of 0.05 millimeters per second to about 500 millimeters per second. In another embodiment, the pulling rate ranges from about of 0.5 millimeters per second to about 50 millimeters per second. In another embodiment, the pulling rate is about of 5 millimeters per second.

In another embodiment of the method for assembling semiconducting nanowires into yarn, the electrostatic charge is selected from (1) a unipolar charge of a positive sign applied to said substrate; or (2) a unipolar charge of a negative sign applied to said substrate.

In another embodiment of the method for assembling semiconducting nanowires into yarn, the electrostatic charge that can be applied ranges from about 10 V/cm to about 10,000 V/cm. In another embodiment, the electrostatic charge that can be applied ranges from about 10 V/cm to about 1,000 V/cm. In another embodiment, the electrostatic charge that can be applied ranges from about 10 V/cm to about 100 V/cm. In another embodiment, the electrostatic charge that can be applied ranges from about 10 V/cm to about 50 V/cm. In another embodiment, the electrostatic charge that can be applied ranges from about 10 V/cm to about 40 V/cm. In another embodiment, the electrostatic charge that can be applied ranges from about 10 V/cm to about 30 V/cm. In another embodiment, the electrostatic charge that can be applied is less than 40 V/cm.

In another embodiment of the method for assembling semiconducting nanowires into yarn, the nanowires are first washed to remove any excess ligand. In another embodiment, the nanowires are nanowire solutions that are at concentrations from about $10^{-13}$ to about $10^{-10}$ M. In another embodiment, the nanowires are nanowire solutions that are at concentrations from about $10^{-12}$ to about $10^{-11}$ M.

In another embodiment of the method for assembling semiconducting nanowires into yarns, said nanowires are selected from zinc oxide, zinc sulfide, zinc selenide, zinc telluride, cadmium sulfide, cadmium selenide, cadmium telluride, mercury sulfide, mercury selenide, mercury telluride, germanium sulfide, germanium selenide, germanium telluride, tin sulfide, tin selenide, tin telluride, lead sulfide, lead selenide, lead telluride, and lead selenium sulfide, Si, Ge, GaP, GaAs, InP, InAs, or combinations thereof. In another embodiment, the nanowire is selected from ZnO, ZnSe, CdS, CdSe, CdTe, PbS, PbSe or combinations thereof. In another embodiment, the nanowire is selected from ZnO, ZnSe, Si, Ge, or combinations thereof.

In another embodiment of the method for assembling semiconducting nanowires into yarns, the substrate is selected from paper, alumina, silk, fur, lead, wool, nylon, hair, borosilicate, quartz, sapphire, leather, dry human skin, Teflon, silicon, PVC, polypropylene, polyethylene, polyurethane, polystyrene, polyester, gold, platinum, brass, silver, nickel, copper, hard rubber, amber, wood asbestos, mica, wool, wax, latex, neoprene, sulfur, acetate, acrylic, cellophane, polycarbonate, polyimide, polyethylene terephthalate, polyvinylidene chloride, polychlorotrifluoroethylene, polyvinylidene fluoride, polytetrafluoroethylene, indium-tin-oxide coated glass, or fluorinated tin oxide glass. In another embodiment, the substrate is selected from borosilicate, copper or Teflon.

In another embodiment of the method for assembling semiconducting nanowires into yarns, the alignment area, which refers to aligned nanowires on a substrate, can be from about $10^{-6}$ $m^2$ to the size of any surface area that can be charged. In another embodiment, the size of the alignment area can be from about 1 $cm^2$ to about 100 square feet. In another embodiment, the size of the alignment area can be from about 1 square foot to about 100 square feet. In another embodiment, the size of the alignment area can be from about 10 square feet to about 50 square feet. In another embodiment, the size of the alignment area can be about 20 square feet.

In another embodiment of the method for assembling semiconducting nanowires into yarns, the dielectric solvent is selected from hexane, toluene, benzene, carbon disulfide, carbon tetrachloride, cyclohexane, dibutyl ether, diethylamine, 1,4-dioxane, trichloroethylene, triethylamine, chlorobenzene, heptane, pentane, propanoic acid, m-xylene, o-xylene, p-xylene, octane, tetrahydrofuran, chloroform, dimethylformamide, or mixtures thereof. In another embodiment, the dielectric solvent is selected from pentane, hexane, heptane, octane, toluene, carbon tetrachloride, cyclohexane, tetrahydrofuran, chloroform, or mixtures thereof. In another embodiment, the dielectric solvent is hexane, toluene, or mixtures thereof.

In another embodiment of the method for assembling semiconducting nanowires into yarns, substrate is charged by rubbing its surface with a tissue or glove or by using an electrostatic generator to deposit charges onto the substrate. In another embodiment, the electrostatic generator is a van de Graaff electrostatic generator.

Another aspect of the invention relates to a method for assembling semiconducting nanowires into segmented yarns, said method comprising: providing more than one mixture, each mixture comprising a low dielectric solvent and at least two semiconducting nanowires; depositing said more than one mixture on top of a substrate, applying an electrostatic charge to said more than one mixture under lighting conditions; and allowing each group of said at least two semiconducting nanowires to alligate into one yarn and form segmented yarns. The lighting conditions that can be employed in this aspect of invention include, but is not limited to, to ambient light illumination, LED light, lamp light, and laser light. Any of the embodiments described in the other aspects of the invention described above can be employed in this aspect of the invention where applicable.

Another aspect of the invention relates to a method for assembling semiconducting nanowires into segmented yarns, said method comprising: providing more than one mixture, each said more than one mixture comprising a dielectric solvent and at least two semiconducting nanowires; depositing said more than one mixture on top of a Teflon substrate; applying an electrostatic charge to said substrate using a tissue or an electrostatic generator; introducing a conduit into one of said more than one mixtures and pulling up said conduit, wherein a first yarn of at least two semiconducting nanowires is formed; pulling away said conduit from said one of said more than one mixtures and placing the bottom of said first yarn of at least two semiconducting nanowires into a second of the other said more than one mixtures, wherein at least one yarn of at least two semiconducting nanowires is formed, and characterized by assembling nanowires using LINA (light induced nanowire assembly), said LINA, comprising; applying lighting conditions to said at least two semiconducting nanowires; and allowing said at least two semiconducting nanowires to alligate into said first yarn during said pulling away of said conduit from one of said more than one mixtures and said placing of the bottom of said first yarn of at least two semiconducting nanowires into said second of the other said more than one mixtures to form segmented yarns. The lighting conditions that can be employed in this aspect of invention include, but are not limited to, to ambient light illumination, LED light, lamp light, and laser light. Any of the embodiments described in the other aspects of the invention described above can be employed with this aspect of the invention where applicable.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope of the disclosure unless otherwise claimed. No language in the specification should be construed as indicating any non-claimed element as essential to the practice of the disclosure as used herein.

The present disclosure pertains to the use of light and an electric field to assemble semiconducting nanowires into yarns and films. For the purposes of this disclosure, the process of assembling the nanowires has been generally termed Light Induced Nanowire Assembly ("LINA"), which may include all steps taken in order to achieve a final product of a semiconducting nanowire yarn or film. LINA may also refer to nanowires that are subjected to a potential wherein the potential gradient is called an electric field. This field interacts with any induced dipoles within the wires and the resulting interaction potential energy allows the wires to align along the field lines.

FIG. 1 is a perspective view, which illustrates an embodiment of a method of assembling semiconducting nanowires into yarn.

Figure 6:
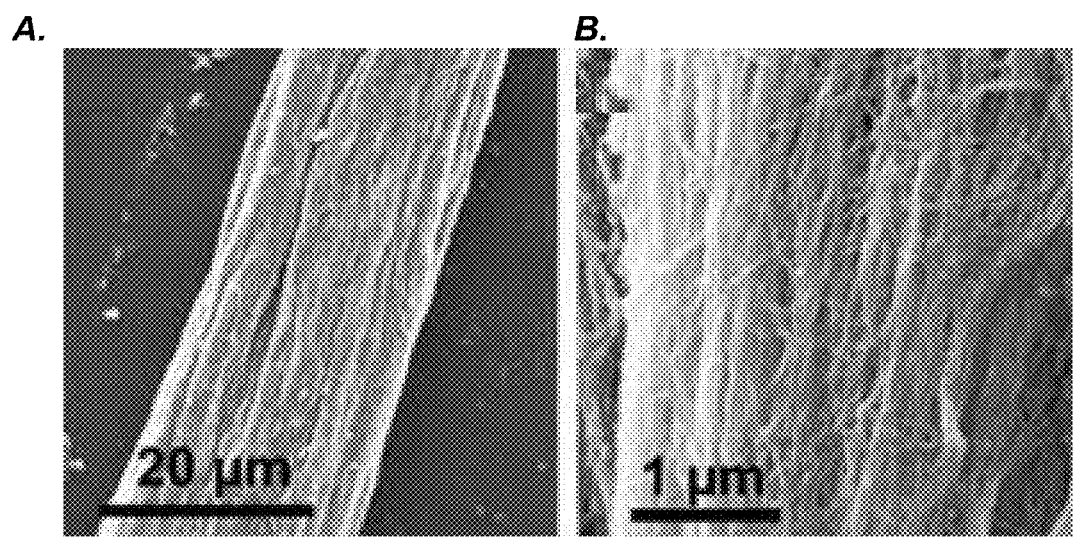
FIG. 6 shows SEM images of a CdSe nanowire yarn after soaking in toluene for greater than three months ((A) magnification showing 20 μm size bar; (B) magnification showing 1 μm).

In one embodiment, a mixture is provided comprising hexane and at least two semiconducting nanowires that are used to create yarns. An electrostatic charge may be applied to a Teflon substrate using a triboelectric material, such as a tissue. The resulting electrostatic field resulting from the electrostatic charge has electric field lines that are "normal" to the plane of the Teflon substrate. The mixture may then be deposited on top of the Teflon substrate. External radiation may be applied to the semiconducting nanowires in the form of light radiation. The amount of energy of the incident photons applied to the semiconducting nanowires must be enough to the point where electrons on the semiconducting nanowires are excited with an energy greater than the intrinsic band gap of the material that creates electron-hole pair excitations. A conduit, such as pipette or syringe, may then be used to apply the mixture on top of the substrate to the extent where the tip of the conduit may either be partially or completely submerged in the mixture. The submerged pipette tip may then be pulled out of the mixture by hand. A semiconducting nanowire yarn will begin to form at the end of the tip due to dipole-dipole interactions occurring between semiconducting nanowires. The yarns will increase in length in the direction of the electric field lines as long as there are nanowires in the mixture. The yarns created have been shown to be very stable; samples have been submerged in toluene for more than three months and no degradation has been visible to the naked eye. FIG. 6 shows SEM images of a CdSe nanowire yarn after soaking in toluene for more than three months.

Figure 2:
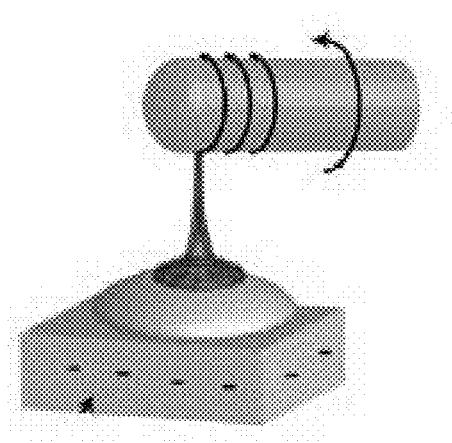
FIG. 2 shows an illustration of the mechanical yarn pulling process.

In another embodiment, alligating semiconducting nanowires into yarns on a substrate may be accomplished using a mechanical method. This may allow for a more controlled yarn-pulling rate and reduces the human error factor in the process. The mechanical pulling apparatus used may consist of a stepper motor coupled to a step-down gear. A Pyrex test tube may then be coupled to the rotation shaft. To charge the substrate, a Van de Graaff generator may be used. Upon charging the substrate with a Van de Graaff generator, a small reservoir of a nanowire suspension on a glass microscope coverslip is gently contacted to the test tube surface. The tube is then slowly pulled away to produce a nanowire yarn similar to a nanowire yarn created in the manual pulling process. The yarn is anchored to the side of the test tube and upon rotation slowly wraps around the test tube. FIG. 2 provides an illustration of the mechanical yarn creation method.

In another embodiment, more than one mixture is provided comprising hexane and at least two semiconducting nanowires that are used to create segmented yarns. In each mixture, either one type of semiconducting nanowire or more than one type of semiconducting nanowire may exist. An electrostatic charge may be applied to a Teflon substrate using a triboelectric material, such as a tissue. The resulting electrostatic field resulting from the electrostatic charge has electric field lines that extend perpendicularly outward from the surface of the Teflon substrate. The mixtures may then be deposited on top of the Teflon substrate. External radiation may be applied to the semiconducting nanowires in the form of light radiation. Nanowire photoexcitation creates electron hole pairs. These photogenerated carriers may then ultimately result in spatially asymmetric charge distributions across the nanowire length due to different electron and hole mobilities.

The resulting asymmetric charge distribution enables NW manipulation. In particular, asymmetric charge distributions can interact with external electric fields through Coulomb forces, causing macroscopic nanowire alignment. A pipette may then be introduced into one of the more than one mixtures on top of the Teflon substrate to the extent where the tip of the pipette may either be partially or completely submerged in the mixture. The pipette employed can be a borosilicate glass pipette. The submerged pipette tip may then be pulled out of the mixture by hand or by an automated process. A semiconducting nanowire yarn will begin to form at the end of the tip due to dipole-dipole interactions occurring between semiconducting nanowires. Once a desired length of yarn is formed, the bottom end of the formed yarn may be introduced into another mixture. The submerged pipette tip may then be pulled out of this second mixture by hand or by an automated process. A second semiconducting nanowire yarn will begin to form at the bottom end of the first yarn due to dipole-dipole interactions occurring between semiconducting nanowires. The process of dipping bottom ends of yarns may be repeated until the desired amount of segmented yarns are formed.

Alternatively, heterostructured yarns can be made by mixing different types of semiconductor NWs onto the same charged substrate for a "one-pot" preparation. If broad band illumination is used, the resulting yarn, when pulled, will consist of intermixed nanowires of different compositions. However, if the illuminating light source is monochromatic and is tuned to the band gap of a given semiconductor while not exciting the other wires of different composition, selective yarn formation will ensue during the pulling process. Thus by varying the illumination frequency one can enable the selective real time pulling of a different NW composition. Thus, if NW A absorbs only green light while nanowire B absorbs only red light alternating the illumination frequency from red to green and back to red can lead to a segmented thread of the form BAB. More realistically, since the absorption spectra of many semiconductors overlap in the blue, there will be limitations to this selective pulling process. For example, the band gaps of CdS, CdSe and CdTe all overlap at wavelengths below about 500 nm. Thus, illuminating a NW mixture with red light (e.g., 700 nm) will cause CdTe NWs to form a thread during the pulling process. Next, changing the illumination wavelength to about 600 nm will cause both CdSe and CdTe wires to be drawn into the growing thread. Finally, changing the illumination wavelength to about 450 nm will cause all three types of NWs, CdS, CdSe, and CdTe, to be drawn into the thread.

When a semiconductor is exposed to lighting conditions, such as external radiation (e.g., ambient light or a light source), the radiation excites electrons on the semiconductor and when the semiconductor is exposed to an electric field (such as in a triboelectrically charged substrate or by using a van de Graaff electrostatic generator to deposit charges onto the semiconductor), the excited electrons and holes create dipoles which subsequently attempt to align head-to-head and side-to-side, as these are preferred orientations for dipole-dipole interactions. In the case of the semiconducting nanowire yarns, it is this head-to-head and side-to-side alignment of the dipoles that allow the nanowires to alligate and form yarns and films.

Non-limiting examples of these semiconducting nanowires, for purposes of this disclosure, are meant to include zinc oxide, zinc sulfide, zinc selenide, zinc telluride, cadmium sulfide, cadmium selenide, cadmium telluride, mercury sulfide, mercury selenide, mercury telluride, germanium sulfide, germanium selenide, germanium telluride, tin sulfide, tin selenide, tin telluride, lead sulfide, lead selenide, lead telluride, and lead selenium sulfide, Si, Ge, GaP, GaAs, InP, InAs, or combinations thereof. In another embodiment, nanowire is selected from ZnO, ZnSe, CdS, CdSe, CdTe, PbS, PbSe or combinations thereof. In yet another embodiment, the nanowire is selected from ZnO, ZnSe, Si, Ge, or combinations thereof.

Yarns and films created using embodiments of the disclosure that create yarns or films may contain a mixed composition of more than one semiconducting nanowire. Segmented yarns created using embodiments of the disclosure that create segmented yarns may contain a mixed composition of more than one semiconducting nanowire yarn in one or more segments of the segmented yarn. A yarn, film, or segmented yarn comprising more than one type semiconducting nanowire as yarn may exhibit supplementary functionality in comparison to a yarn, film, or segmented yarn comprising one type of semiconducting nanowire described above.

Non-limiting examples of dielectric solvents that can be used include hydrocarbon solvents, halogenated hydrocarbon solvents, various amines, certain ethers, and the like. Specific examples include pentane, hexane, heptane, octane, cyclohexane, benzene, toluene, m-xylene, o-xylene, p-xylene, chlorobenzene, diethylamine, triethylamine, dibutyl ether, tetrahydrofuran, 1,4-dioxane, carbon disulfide, trichloroethylene, carbon tetrachloride, chloroform, propanoic acid, dimethylformamide, and mixtures thereof. In another embodiment, the dielectric solvent is selected from pentane, hexane, heptane, octane, toluene, carbon tetrachloride, cyclohexane, tetrahydrofuran, chloroform, and mixtures thereof. In another embodiment, the dielectric solvent is hexane, toluene, or mixtures thereof.

Non-limiting examples of substrate that can used include paper, alumina, silk, fur, lead, wool, nylon, hair, borosilicate, quartz, sapphire, leather, dry human skin, Teflon, silicon, PVC, polypropylene, polyethylene, polyurethane, polystyrene, polyester, gold, platinum, brass, silver, nickel, copper, hard rubber, amber, wood asbestos, mica, wool, wax, latex, neoprene, sulfur, acetate, acrylic, cellophane, polycarbonate, polyimide, polyethylene terephthalate, polyvinylidene chloride, polychlorotrifluoroethylene, polyvinylidene fluoride, polytetrafluoroethylene, indium-tin-oxide coated glass, or fluorinated tin oxide glass. In another embodiment, the substrate is selected from borosilicate, copper or Teflon.

The above materials may be used in any embodiments creating a final product of semiconducting nanowire yarns or segmented semiconducting nanowire yarns.

Figure 5:
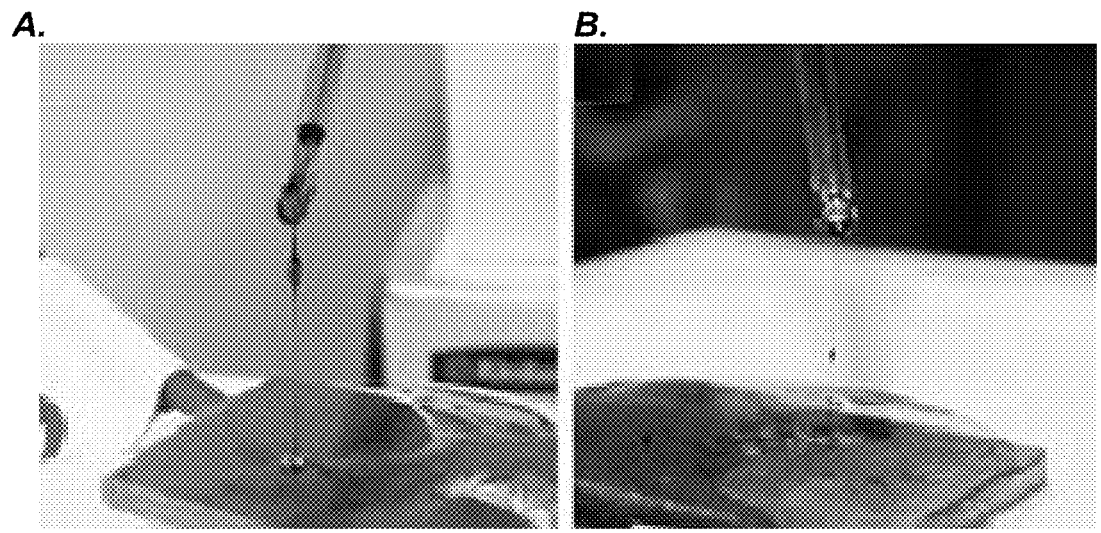
FIG. 5 shows CdSe nanowire yarns pulled from (A) positively and (B) negatively charged substrates.

For the purposes of this disclosure, it is understood that the term "substrate" refers to any material that can accumulate a charge. One or more mixtures may be placed on top of different substrates in different embodiments in the disclosure. The substrate may comprise any of the triboelectric materials listed in the above paragraph as well as any other materials that may accumulate a charge. The substrate that is to be charged by a material can either become negatively or positively charged in order to carry out the process of creating nanowire yarns or films. FIG. 5 provides an example of this concept, showing CdSe nanowire yarns being pulled from positively (left) and negatively (right) charged substrates.

Figure 8:
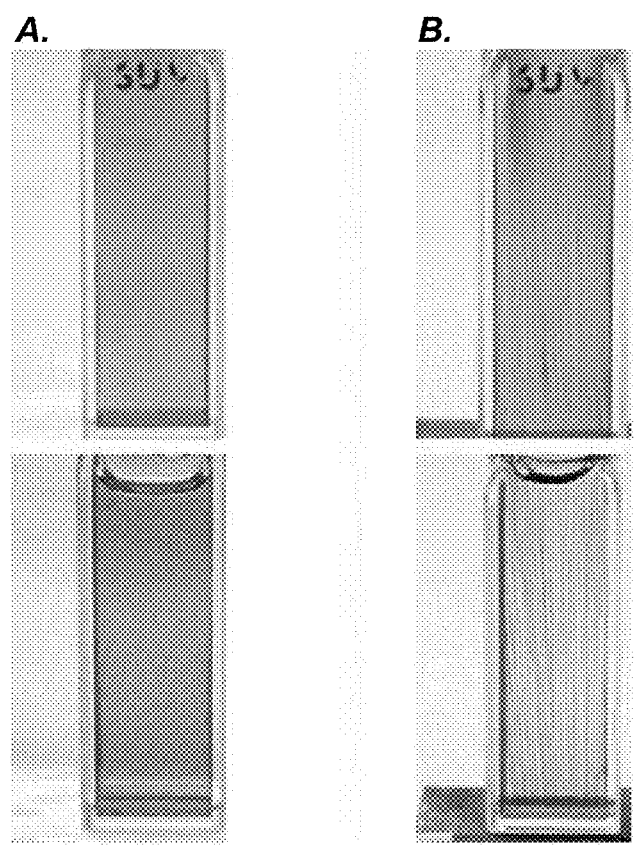
FIG. 8 shows CdSe nanowires suspended in toluene (top) and hexane (bottom), (A) before and (B) after placing the cuvette on a charged copper plate.

For the purposes of this disclosure, it is understood that the term "on top of", in reference to the mixtures, refers to the semiconducting nanowire solution being placed directly on top of a substrate or directly on top of a second substrate on top of a substrate, in order that the solution stay within the bounds of the top side of the substrate and/or the second substrate. In an embodiment, a mixture may be placed on top of a glass slide which is placed on top of a charged substrate. In another embodiment, a mixture may be contained in a cuvette which is placed on top of a charged substrate. FIG. 8 shows CdSe nanowires suspended in toluene (top) and hexane (bottom) before and after placing the cuvette on a charged copper plate. These embodiments do not pose a limitation on the scope of the disclosure.

For the purposes of this disclosure, it is appreciated that the term "electrostatic generator" refers to any device that produces static electricity, wherein device refers to a contrivance or an disclosure serving a particular purpose (in this case, the purpose of producing static electricity). An electrostatic generator may be used to charge a substrate that is used in any embodiments creating a final product of semiconducting nanowire yarns or segmented semiconducting nanowire yarns. A Van de Graaff generator is an example of an electrostatic generator and does not pose a limitation on the scope of the disclosure. Any electrostatic generator that falls under the category of electrostatic generator according to the definition above may be used to charge a substrate that is used in any embodiments creating a final product of semiconducting nanowire yarns or segmented semiconducting nanowire yarns.

To create the mobile charge carriers, energy must be applied that exceeds the bandgap of a material. For example, energy in the above specified range can be used to create mobile charge carriers on zinc oxide (bandgap: 3.37 eV), zinc sulfide (bandgap: 3.6 eV), zinc selenide (bandgap: 2.7 eV), zinc telluride (bandgap: 2.25 eV), cadmium sulfide (bandgap: 2.42 eV), cadmium selenide (bandgap: 1.73 eV), cadmium telluride (bandgap: 1.49 eV), mercury sulfide (bandgap: 2.1 eV), germanium sulfide (bandgap: 3.1 eV), germanium selenide (bandgap: 1.07 eV), germanium telluride (bandgap: 0.6 eV), tin sulfide (bandgap: 1.30 eV), tin selenide (bandgap: 1.25 eV), tin telluride (bandgap: 0.25 eV), lead sulfide (bandgap: 0.37 eV), lead selenide (bandgap: 0.27 eV), and lead telluride (bandgap: 0.32 eV).

Figure 12:
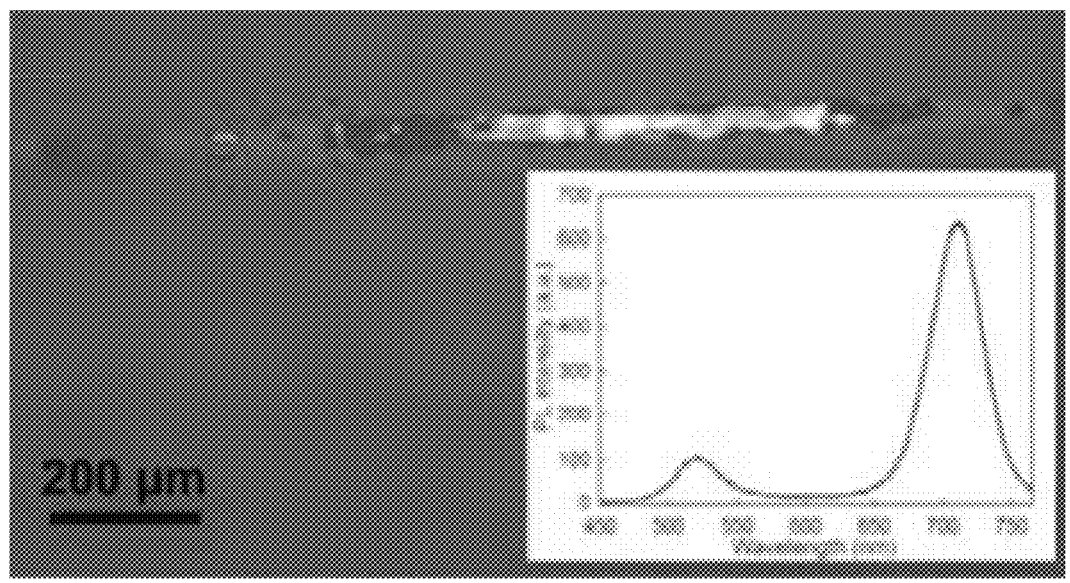
FIG. 12 shows emission from a CdSe quantum dot CdSe nanowire yarn composite. The inset graph is an emission spectrum of the yarn showing emission from both quantum dots (at ~525 nm) and nanowires (at ~710 nm). Non-uniform emission intensities may originate from random void spaces within the nanowire yarn.

In another embodiment, a mixture used in the semiconducting nanowire yarn/film process may further comprise nanomaterials selected from the group of fullerenes, carbon nanotubes, quantum dots, nanogold, nanosilver, metal oxides, dendrimers, and composites. Due to the porosity of the semiconducting nanowire yarns and films, nanomaterials may be able to be stably dispersed throughout the yarns and films. Nanomaterials allow for the supplementary functionality of properties of semiconducting nanowire yarns and films, such as an increase in the conductivity of semiconducting nanowire yarns and films. FIG. 12 shows emission from a CdSe quantum dot CdSe nanowire yarn composite. The inset graph is an emission spectrum of the yarn showing emission from both quantum dots (at ~525 nm) and nanowires (at ~710 nm), which shows that quantum dots may be successfully dispersed in semiconducting nanowire yarns. Non-uniform emission intensities in the graph likely originate from random void spaces within the nanowire yarn.

For the purposes of this disclosure, it is understood that the term "conduit" may refer to a natural or artificial channel through which something (in the current disclosure, a mixture) may be conveyed. In the disclosure, a conduit is necessary in order to be able to continue the process of nanowire alligation. In an embodiment, a pipette is placed into a mixture, capillary action takes place and a certain amount of the mixture is sucked into the end of the pipette. Once a certain amount of the mixture has been sucked into the pipette, nanowires in the mixture electrostatically attract to the pipette. This forms a base for which a semiconducting yarn may be created. Other variations of a conduit recognized by one skilled in the art may be utilized in any embodiment concerning the creation of semiconducting nanowire yarns.

Figure 11:
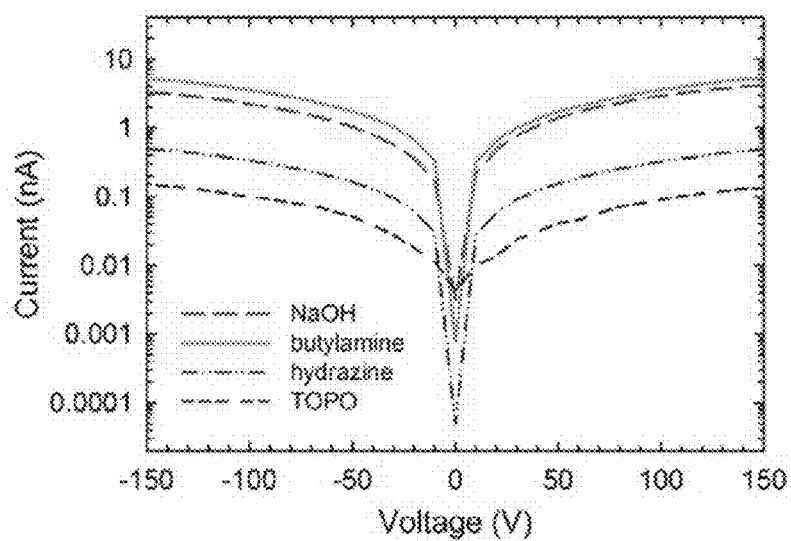
FIG. 11 shows Current versus Voltage curves of treated yarns showing improvements for all treatments.
Figure 13:
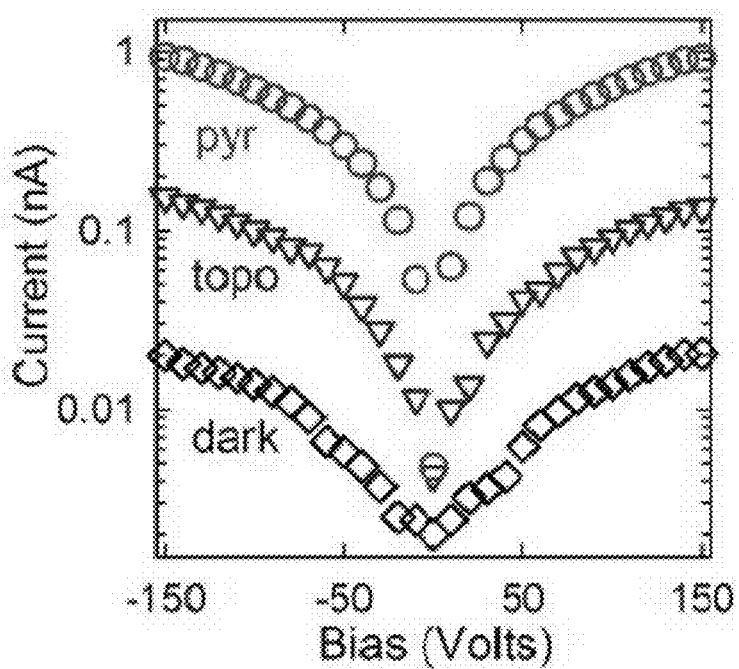
FIG. 13 shows measured dark current (diamonds) of a trioctylphosphine oxide (TOPO) passivated CdSe nanowire yarn and photocurrents from a TOPO passivated and pyridine washed CdSe yarn, denoted by triangles and circles.

In another embodiment, post treatments that can be applied to alligated semiconducting nanowires are selected from the group of pyridine, hydrazine, NaOH, and butylamine treatments. The post treatments serve the purpose of improving the photoconductivities of alligated semiconducting nanowires. For example, FIG. 11 shows current versus voltage curves for CdSe nanowire yarns with four different post treatments (pyridine, hydrazine, NaOH, and butylamine treatments). An increase in the current, or flow of electric charge, can be seen for all treated CdSe nanowire yarns. Another example, FIG. 13, shows the measured dark current of a TOPO passivated CdSe nanowire yarn and photocurrents from a TOPO passivated and a pyridine washed CdSe yarn. The differences in the currents of the three yarns show the influence of light and post treatment on a semiconducting nanowire yarn. The dark current of the CdSe nanowire yarn is much less than that of the current of the CdSe nanowire yarn and post treated CdSe nanowire yarn, which shows that light is an important factor in the alligation of semiconducting nanowires. The current of the treated CdSe nanowire yarn is much more than the dark current of the CdSe nanowire yarn and the current of the CdSe nanowire yarn, which shows that post treatments enhance the photoconductivities of semiconducting nanowire yarns.

For the purposes of this disclosure, it is understood that the term "semiconducting nanowire yarn", "segmented nanowire yarn", "nanowire yarn", and "yarn" may refer to alligated semiconducting nanowires structurally similar to a yarn, wherein the allegation may include one or more types of semiconducting nanowires as described above. For the purposes of this disclosure, it is understood that the term "semiconducting nanowire film", "nanowire film", and "film" may refer to alligated semiconducting nanowires structurally similar to a film, wherein the alligation may include one or more types of semiconducting nanowires as described above.

The diameters of the semiconducting nanowire yarns can be modified by changing either the concentration of nanowires in solution or by changing the pulling rate of the yarns. If the draw rate of the yarns is increased, smaller diameter yarns will be produced; if the draw rate of the yarns is decreased, larger diameter yarns will be produced. Similarly, if the concentration of nanowires in solution is decreased, then the wires will have a smaller diameter and if the concentration of nanowires in solution is increased, then the wires will have a larger diameter. For example, a 10 micrometer yarn with about $7 \times 10^8$ nanowires per centimeter of length is the result of a pulling rate of 5 millimeters per second (assuming a $10^{-11}$ M solution concentration). The altering of the concentrations of nanowires in solution also affects the films in a similar manner to the yarns.

Figure 14:
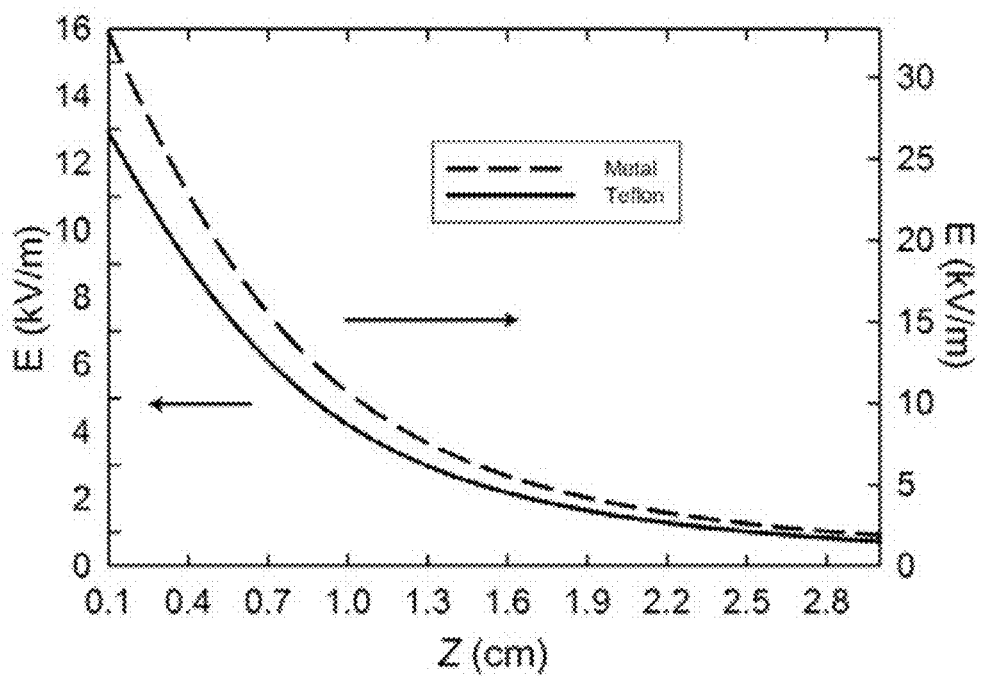
FIG. 14 shows the calculated electric field from the charged copper plate (dashed black line) and Teflon block (solid black line). The fields at 1 cm distance are 10.6 kV/m and 4.2 kV/m for copper and Teflon, respectively. The fields at 3 mm distance are 25.9 kV/m for copper and 10.2 kV/m for Teflon.

The electric field strength of the electric field applied to a substrate may directly affect the alignment capabilities of semiconducting nanowires. The electric field strength a distance (z) above a substrate is given by:

$$E(z) = \frac{\sigma}{2\epsilon\epsilon_0}\left(1 - \frac{z}{\sqrt{s^2 - z^2}}\right)$$

where $\sigma$ is the surface charge density of the substrate, $\epsilon$ is the dielectric constant of the nanowires, R is the radius of the substrate, and $\epsilon_0$ is the permittivity of free space ($8.854 \times 10$ $C^2 m^{-2} N^{-1}$). FIG. 14 shows the exponential decay of the strength of an electric field on a nanowire as the distance of the nanowire from the source of the electric field (metal and Teflon substrates) is increased.

The dipole induced in a non-illuminated nanowire is given by:

$$\rho_{ind} = \frac{\pi r^2 l}{2}\epsilon_0\epsilon_m\left(\frac{\epsilon - \epsilon_m}{\epsilon_m}\right)E(z)$$

where r is the radius of the nanowire, l is the length of the nanowire, and $\epsilon_m$ is the dielectric constant of the surrounding medium (low dielectric solvent). It can be seen from this equations that the electric field strength directly affects the induced dipole forces of nanowires. If the electric field strength decreases, then the interaction of nanowires is not as strong. This leads to a less stable nanowire yarn. Upon absorbing ambient light, photogenerated carriers within the nanowire may increase the actual dipole present by orders of magnitude in the presence of an external electric field.

The semiconducting nanowire solutions of the present disclosure can be prepared by any of preparation methods known in the art, such as by solution-liquid-solid growth, or SLS growth. For example, a typical synthesis of 6 nm diameter CdSe nanowires follows. Cadmium oxide (25 mg, 0.19 mmol), oxalic acid (0.23 mL, 1.45 mmol), and TOPO 99% (2.5 g, 6.47 mmol) are first mixed in a 3-neck flask that was subsequently heated/degassed at 100° C. for 50 minutes. The temperature of the reaction mixture is then raised to 320° C. under nitrogen until it turns clear. After this, the temperature is lowered to 250° C. whereupon an injection solution consisting of 1 M TOPSe (25 µL, 25 µmol) and 2 mM bismuth chloride in acetone (12.5 µL, $2.5 \times 10^{-8}$ mol) is introduced. On injection, the color of the reaction mixture turns orange, whereupon it proceeds to black within a few seconds. The reaction mixture is then left heated for 2 minutes at 250° C., whereafter it is cooled to room temperature. The reaction mixture is then further diluted with toluene (e.g., about 5 mL) to prevent TOPO from solidifying.

Nanowires can be precipitated from solution by adding methanol (3 mL) and by centrifuging the resulting suspension. The recovered nanowire product is then washed two times with a (70:30) toluene/methanol mixture.

DEFINITIONS

The following definitions are included to provide a clear and consistent understanding of the specification and claims. As used herein, the recited terms have the following meanings. All other terms and phrases used in this specification have their ordinary meanings as one of skill in the art would understand. Such ordinary meanings may be obtained by reference to technical dictionaries, such as *Hawley's Condensed Chemical Dictionary* 14$^{th}$ Edition, by R. J. Lewis, John Wiley & Sons, New York, N.Y., 2001.

References in the specification to "one embodiment", "an embodiment", etc., indicate that the embodiment described may include a particular aspect, feature, structure, moiety, or characteristic, but not every embodiment necessarily includes that aspect, feature, structure, moiety, or characteristic. Moreover, such phrases may, but do not necessarily, refer to the same embodiment referred to in other portions of the specification. Further, when a particular aspect, feature, structure, moiety, or characteristic is described in connection with an embodiment, it is within the knowledge of one skilled in the art to affect or connect such aspect, feature, structure, moiety, or characteristic with other embodiments, whether or not explicitly described.

The singular forms "a," "an," and "the" include plural reference unless the context clearly dictates otherwise. Thus, for example, a reference to "a compound" includes a plurality of such compounds, so that a compound X includes a plurality of compounds X. It is further noted that the claims may be drafted to exclude any optional element. As such, this statement is intended to serve as antecedent basis for the use of exclusive terminology, such as "solely," "only," and the like, in connection with any element described herein, and/or the recitation of claim elements or use of "negative" limitations.

The term "and/or" means any one of the items, any combination of the items, or all of the items with which this term is associated. The phrase "one or more" is readily understood by one of skill in the art, particularly when read in context of its usage.

The term "about" can refer to a variation of ±5%, ±10%, ±20%, or ±25% of the value specified. For example, "about 50" percent can in some embodiments carry a variation from 45 to 55 percent. For integer ranges, the term "about" can include one or two integers greater than and/or less than a recited integer at each end of the range. Unless indicated otherwise herein, the term "about" is intended to include values, e.g., weight percentages, proximate to the recited range that are equivalent in terms of the functionality of the individual ingredient, the composition, or the embodiment. The term about can also modify the end-points of a recited range as discuss above in this paragraph.

As will be understood by the skilled artisan, all numbers, including those expressing quantities of ingredients, properties such as molecular weight, reaction conditions, and so forth, are approximations and are understood as being optionally modified in all instances by the term "about." These values can vary depending upon the desired properties sought to be obtained by those skilled in the art utilizing the teachings of the descriptions herein. It is also understood that such values inherently contain variability necessarily resulting from the standard deviations found in their respective testing measurements.

As will be understood by one skilled in the art, for any and all purposes, particularly in terms of providing a written description, all ranges recited herein also encompass any and all possible sub-ranges and combinations of sub-ranges thereof, as well as the individual values making up the range, particularly integer values. A recited range (e.g., weight percentages or carbon groups) includes each specific value, integer, decimal, or identity within the range. Any listed range can be easily recognized as sufficiently describing and enabling the same range being broken down into at least equal halves, thirds, quarters, fifths, or tenths. As a non-limiting example, each range discussed herein can be readily broken down into a lower third, middle third and upper third, etc. As will also be understood by one skilled in the art, all language such as "up to", "at least", "greater than", "less than", "more than", "or more", and the like, include the number recited and such terms refer to ranges that can be subsequently broken down into sub-ranges as discussed above. In the same manner, all ratios recited herein also include all sub-ratios falling within the broader ratio. Accordingly, specific values recited for radicals, substituents, and ranges, are for illustration only; they do not exclude other defined values or other values within defined ranges for radicals and substituents.

One skilled in the art will also readily recognize that where members are grouped together in a common manner, such as in a Markush group, the invention encompasses not only the entire group listed as a whole, but each member of the group individually and all possible subgroups of the main group. Additionally, for all purposes, the invention encompasses not only the main group, but also the main group absent one or more of the group members. The invention therefore envisages the explicit exclusion of any one or more of members of a recited group. Accordingly, provisos may apply to any of the disclosed categories or embodiments whereby any one or more of the recited elements, species, or embodiments, may be excluded from such categories or embodiments, for example, for use in an explicit negative limitation.

The term "contacting" refers to the act of touching, making contact, or of bringing to immediate or close proximity, including at the molecular level, for example, to bring about a chemical reaction, or a physical change, e.g., in a solution or in a reaction mixture.

An "effective amount" refers to an amount effective to bring about a recited effect, such as an amount necessary to form products in a reaction mixture. Determination of an effective amount is typically within the capacity of persons skilled in the art, especially in light of the detailed disclosure provided herein. The term "effective amount" is intended to include an amount of a compound or reagent described herein, or an amount of a combination of compounds or reagents described herein, e.g., that is effective to form products in a reaction mixture. Thus, an "effective amount" generally means an amount that provides the desired effect.

The term "longitudinal optical (LO) phonon" refers to reflecting the collective vibration of atoms in a solid.

The term "quantum dots" refers generally to a spherical semiconductor particle with a diameter that is equal to or smaller than the bulk exciton Bohr radius of the material. For many semiconductors this is on the nm scale. The bulk exciton Bohr radius is, in turn, related to the natural length scales of carriers in a solid.

The terms "alligate" and "assemble" both refer to the attaching or binding of semiconducting nanowires with other semiconducting nanowires.

The term "mixture" or "homogeneous mixture" refers to a composition comprising a low dielectric solvent and at least two semiconducting nanowires, which can be the same or different.

The term "solvent" or "dielectric solvent" refers to a medium that suspends the semiconducting nanowires in the mixture. The term dielectric solvent in all aspects and embodiments of this invention is meant to include, without limitation, "low dielectric solvents", and for purposes of this disclosure, a "low dielectric solvent" refers to a medium that has a dielectric constant of less than four and greater than zero.

The following Examples are intended to illustrate the above invention and should not be construed as to narrow its scope. One skilled in the art will readily recognize that the Examples suggest many other ways in which the invention could be practiced. It should be understood that numerous variations and modifications may be made while remaining within the scope of the invention. Further description of embodiments of the invention are described by Petchsang et al. in *Advanced Materials* 2013, 25, 601-605.

EXAMPLES

Materials. Bismuth (III) chloride (98%), zinc stearate (~86%) and selenium powder (99.5%) were purchased from Acros. Stearic acid (98%) was purchased from Alfa Aesar. Trioctylphosphine (TOP, 90%), pyridine (99%), cadmium oxide (99.99%+, metal basis), and dodecylamine (99%) were purchased from Sigma Aldrich. Tri-n-octylphosphine oxide (TOPO, 99%) was purchased from Strem Chemicals. Tetradecylphosphonic acid (98%) was purchased from PCI synthesis. Methanol, acetone, and toluene were purchased from Fisher Scientific and VWR. Unless otherwise noted, all chemicals were used as received.

General Chemicals Created for Use in Semiconducting Nanowire Solution. Bi catalyst was freshly prepared prior to each nanowire synthesis by dissolving 12.6 mg (40 µmol) of $BiCl_3$ in 20 mL of acetone. 1M TOPSe was prepared under nitrogen in a glovebox by mixing Se powder (0.39 g, 5 mmol) with TOP (5 mL, 11.2 mmol). The solution was then left to stir overnight to complete the reaction. 0.5 M TOPTe was prepared by mixing Te powder (0.32 g, 2.5 mmol) and TOP (5 mL, 11.2 mmol) in a three-neck flask connected to a Schlenk line. The mixture was heated and degassed under vigorous stirring at 100° C. for 30 minutes. When finished, the flask was backfilled with $N_2$. The temperature was then raised to 170° C. and was kept there for 2 hours or until the Te powder completely dissolved. This yielded a green-yellow solution. Afterward, the mixture was cooled to room temperature and was transferred into an oxygen-free vial, which was kept in a glovebox.

Example 1

ZnSe Semiconducting Nanowires

In a three-neck flask connected to a Schlenk line, TOPO (2.5 g, 6.5 mmol, 99%) was mixed with zinc stearate (30 mg, 47.5 μmol). The mixture was then dried and degassed at 100° C. for 1 hour. Once complete, the vessel was backfilled with $N_2$ and the temperature was raised to 310° C. In tandem, 1M TOPSe (25 μL, 25 μmol), TOP (0.2 mL, 0.45 mmol) and $BiCl_3$ (60 μL acetone solution, 1.68 mmol, 0.1 μmol) were mixed together in a syringe. When the temperature of the growth mixture stabilized, the solution was injected into the three-neck flask, yielding a gradual color change from clear to yellow. After the injection, the resulting reaction mixture was heated at temperatures between 304-307° C. for 30 minutes. Afterwards, it was allowed to cool to 70° C., whereupon 10 mL of toluene was introduced to prevent TOPO from solidifying. Resulting nanowires were precipitated using an excess of methanol (~15 mL) and were recovered by centrifuging the suspension, discarding the supernatant. A 1:1.5 mixture of toluene:methanol (by volume) was then added to remove excess surfactant from the nanowire precipitate. The suspension was again centrifuged and the product was recovered. This washing procedure was repeated at least five more times whereupon the recovered nanowires were stored in toluene.

Example 2

CdSe Semiconducting Nanowires

In a three-neck flask connected to a Schlenk line, TOPO (2.5 g, 6.5 mmol) was mixed with cadmium oxide (30 mg, 0.234 mmol) and stearic acid (0.2 g, 0.7 mmol). The mixture was then dried and degassed at 100° C. for 1 hour. At this point, the vessel was backfilled with $N_2$ and the temperature was raised to 350° C. When the solution became clear, its temperature was decreased to 250° C. At the same time, TOPSe (50 μL, 50 μmol) and $BiCl_3$ (100 μL acetone solution, 0.2 μmol) were mixed together in a syringe. This solution was subsequently injected into the three-neck flask at 250° C. to yield a dark-brown solution. The resulting reaction mixture was left heating for an additional 2 minutes. Afterwards, it was rapidly cooled to 70° C., whereupon 15 mL of toluene was introduced to prevent TOPO from solidifying. Resulting nanowires were precipitated using an excess of methanol (~10 mL) and were recovered by centrifuging the suspension, discarding the supernatant. As part of the washing procedure, the nanowire precipitate was first suspended in pyridine (10 mL) to dissolve any excess cadmium stearate coating the wires. Once centrifuged, a 1.5:1 mixture of toluene:methanol (by volume) was added to remove any additional surfactant from the wires. The toluene suspension was then centrifuged and the wires were recovered. This toluene/methanol washing protocol was repeated at least five more times whereupon the recovered nanowires were stored in toluene.

Example 3

CdTe Semiconducting Nanowires

In a three-neck flask connected to a Schlenk line, TOPO (2.5 g, 6.5 mmol) was mixed with cadmium oxide (20 mg, 0.156 mmol) and decylphosphonic acid (0.07 g, 0.32 mmol). The mixture was then dried and degassed at 100° C. for 1 hour. At this point, the vessel was backfilled with $N_2$ and the temperature was raised to 350° C. When the solution became clear, TOP (2.5 mL, 5.6 mmol) was added and the temperature of the solution was lowered to 285° C. At the same time, TOPTe (50 μL, 25 μmol) and $BiCl_3$ (50 μL acetone solution, 0.1 μmol) were loaded in a different syringe and were subsequently injected into the three neck flask at 285° C. to yield a dark-green solution. The resulting mixture was left heated for an additional 2 minutes. Afterward, it was cooled to 70° C., whereupon 15 mL of toluene was introduced to prevent TOPO from solidifying. Resulting nanowires were precipitated using an excess of methanol (~10 mL) and were recovered by centrifuging the suspension, discarding the supernatant. Once centrifuged, a 1.5:1 mixture of toluene:methanol (by volume) was added to remove any additional surfactant from the wires. The suspension was then centrifuged and the wires were recovered. This toluene/methanol washing protocol was repeated at least five more times whereupon the recovered nanowires were stored in toluene.

Example 4

PbSe Semiconducting Nanowires

In a typical synthesis, TOPO (4 g, 10.3 mmol) was dried and degassed at 100° C. for 2 hours in a three neck round-bottom flask connected to a Schlenk line. The reaction vessel was then backfilled with $N_2$ and the temperature was raised to 210° C. In tandem, $Pb[(SeP^iPr_2)_2N]_2$ (20 mg, 19.6 μmol) was added to TOP (0.3 mL, 0.67 mmol) in a small vial. The mixture was gently heated on a hot plate while shaking it until the single-source precursor dissolved completely to yield a yellow solution. The lead precursor was then cooled to room temperature (~23° C.) and was mixed with a 1 mmol $BiCl_3$ solution (25 μL, 25 nmol) in a syringe. When the temperature of the TOPO stabilized at 210° C., this precursor solution was injected into the three-neck flask. An immediate color change to black resulted. Following injection, the reaction mixture was held at ~210° C. for 2 minutes. Afterward, it was cooled to 70° C., whereupon toluene (~15 mL) was added to prevent TOPO from solidifying. Resulting nanowires were precipitated using excess methanol (~15 mL) and were recovered by centrifuging the suspension, discarding the supernatant. A toluene:methanol mixture (1:1 by volume) was subsequently added to wash the nanowires of excess surfactant. The suspension was again centrifuged and the product was recovered. This washing procedure was repeated at least five more times whereupon the recovered nanowires were stored in toluene.

Example 5

PbS Semiconducting Nanowires

PbS nanowires were synthesized according to a modified literature procedure. TOPO (2 g, 5.2 mmol) was dried and degassed in a three-neck flask connected to a Schlenk line at 100° C. for 1 hour. The reaction vessel was then backfilled with $N_2$ and the temperature was increased to 210° C. Pb$(S_2CNEt_2)_2$ (10 mg, 20 μmol) was added to TOP (0.5 mL, 1.12 mmol) in a glass vial and was dissolved by gently heating it with a heat gun. At the same time, TOP (0.1 mL, 0.22 mmol) and 25 μL (25 nmol) of a 1 mmol $BiCl_3$ solution were combined in a syringe. The Pb precursor solution was then added to the same syringe while hot. The resulting injection solution was rapidly introduced into TOPO at 210° C. The mixture immediately turned black and was held at this temperature for 2 minutes. Thereafter, it was cooled to 70° C. and toluene (~5 mL) was added to prevent TOPO from solidifying. Resulting nanowires were precipitated using excess methanol (~15 mL) and were recovered by centrifuging the suspension, discarding the supernatant. A toluene:methanol mixture (1:1 by volume) was subsequently added to wash the nanowires of excess surfactant. The suspension was again centrifuged and the product was recovered. This washing procedure was repeated at least five more times whereupon the recovered nanowires were stored in toluene.

Example 6

$PbSe_{0.5}S_{0.5}$ Semiconducting Nanowires

In a typical synthesis of $PbSe_{0.5}S_{0.5}$ nanowires, TOPO (4 g, 10.3 mmol) was dried and degassed at 100° C. for 2 hours in a three-neck flask connected to a Schlenk line. The vessel was then backfilled with $N_2$ and the temperature was raised to 210° C. TOP (0.2 mL, 0.45 mmol) was added to Pb((Se$P^iPr_2)_2N)_2$ (20 mg, 19.6 μmol) in a glass vial. The precursor was dissolved by gently heating it on a hot plate. A yellow solution resulted. It was subsequently cooled to room temperature. 2 mmol $BiCl_3$ (25 μL, 50 nmol) was then added and the resulting mixture was loaded into a syringe. In tandem, $Pb(S_2CNEt_2)_2$ (10 mg, 20 μmol) was mixed with TOP (0.5 mL, 1.12 mmol) in a separate glass vial followed by gentle heating with a heat gun to dissolve it. This hot solution was immediately added to the $Pb((SeP^iPr_2)_2N)_2$ containing syringe and was injected into the three-neck flask at 210° C. The mixture immediately turned black and was held at this temperature for 2 minutes. It was subsequently cooled to 70° C., whereupon toluene (~15 mL) was introduced to prevent TOPO from solidifying. Resulting nanowires were purified as described above and were stored in toluene.

Example 7

CdSe Quantum Dots

A mixture of TOPO (2 g, 5.2 mmol), tetradecylphosphonic acid (0.3 g, 1.08 mmol), dodecylamine (0.5 g, 2.7 mmol) and cadmium oxide (50 mg, 0.39 mmol) was dried and degassed in a three-neck flask connected to a Schlenk line at 100° C. for 1 hour. Following this, the vessel was backfilled with $N_2$ and the temperature was raised to 330° C. When the solution became clear, its temperature was decreased to 300° C. At the same time, 1M TOPSe (0.25 mL, 0.25 mmol) and TOP (4 mL, 8.96 mmol) were loaded into a syringe inside a glove box. This solution was then injected into the three-neck flask. The quantum dots were allowed to grow to a desired size by monitoring the color change of the solution. To halt growth, the solution was rapidly cooled to 100° C., whereupon toluene was added to prevent TOPO from solidifying. Resulting quantum dots were precipitated using an excess of methanol. The solution was then washed several times with a toluene/methanol mixture and the recovered quantum dots were subsequently stored in toluene.

Example 8

Manual Yarn Pulling

To manually draw a nanowire yarn, a glass coverslip is place atop a Teflon block that has been triboelectrically charged. A nanowire stock solution of a given concentration is then loaded into a glass pipette or disposable syringe and is brought near the surface of the substrate. The nanowire solution is slowly added to the surface under ambient light illumination at which point a nanowire fiber spontaneously forms between the deposited suspension and the pipette. At this point, the pipette/syringe is slowly pulled away in a direction along the surface normal. As the pipette is withdrawn, the wires begin to bundle. This, along with subsequent solvent evaporation leads to a nanowire yarn that becomes progressively longer as the pipette/syringe is retracted. A visual description of the process is shown in FIG. 1.

Example 9

Mechanical Yarn Pulling

Figure 3:
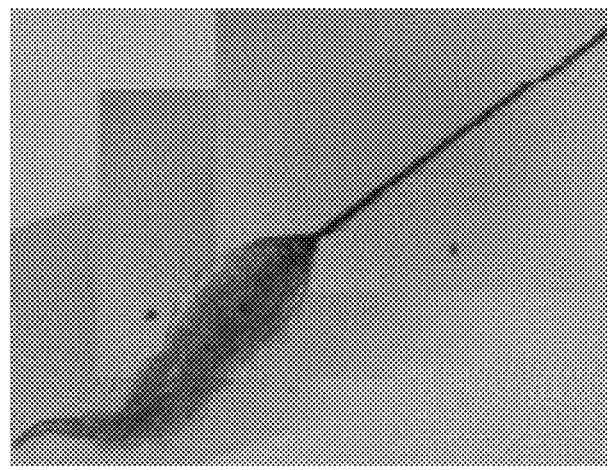
FIG. 3 shows an optical micrograph of a pulled CdSe nanowire yarn showing the end that detaches from the solvent surface.
Figure 4:
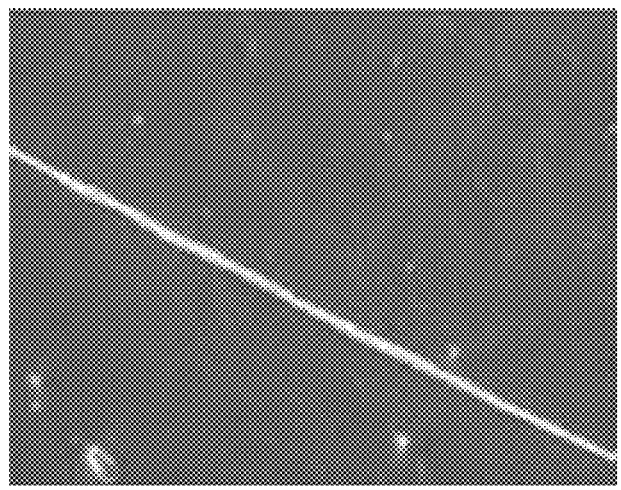
FIG. 4 shows a lower magnification SEM micrograph of a CdSe nanowire yarn.

To allow for controlled yarn pulling rates, a mechanical pulling apparatus was constructed. The instrument consists of a stepper motor (operating at ~67 rpm, although other rpm speeds can be used) coupled to a step-down gear with a ~11 reduction ratio. A Pyrex test tube is then coupled to the rotation shaft, which spins the Pyrex test tube at 6 rpm. Upon charging a Teflon block with a Van de Graaff generator [nanowire yarns can be produced by applying either a positive or negative charge to the substrate (FIG. 5)], a small reservoir of a nanowire suspension on a glass microscope coverslip is gently contacted to the test tube surface. The tube is then slowly pulled away to produce a nanowire yarn much like in the manual pulling process. The yarn is anchored to the side of the test tube and upon rotation, slowly wraps around it. FIG. 2 provides an illustration of the automated yarn drawing process. FIG. 3 shows an optical image of the end of a manually pulled CdSe yarn that has been detached from the solvent surface. The frayed appearance suggests a nanowire bundling mechanism behind yarn formation. Furthermore, the yarn's diameter is relatively uniform over large distances. This is demonstrated by FIG. 4, which shows a low magnification SEM micrograph of a representative CdSe nanowire yarn.

Example 10

Aligned Nanowire Suspensions

Figure 7:
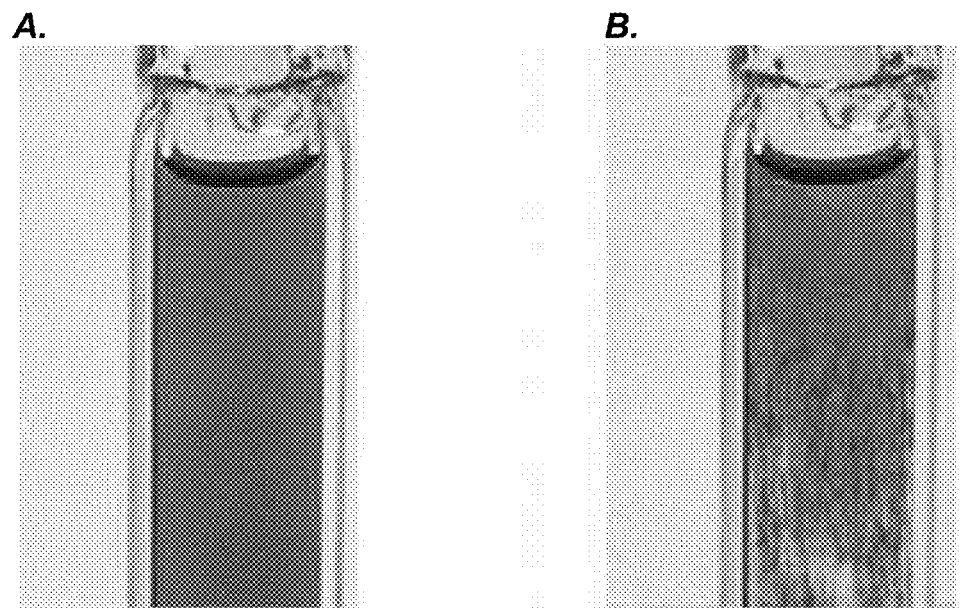
FIG. 7 shows PbSe nanowires in toluene (A) before and (B) after charging the copper plate beneath the cuvette.

Nanowire alignment in the presence of an applied electrostatic field is observed within nanowire suspensions. Specifically, nanowires in a cuvette, placed atop a copper plate, align upon charging the plate with a Van de Graaff generator. This is readily observed in nanowire suspensions that include II-VI materials such as CdSe and CdTe and IV-VI materials such as PbS, $PbSe_{0.5}S_{0.5}$, and PbSe (FIG. 7). Nanowire alignment is also observed in different low dielectric solvents, such as toluene and hexane (FIG. 8).

Example 11

Aligned Nanowire Films

Aligned nanowire films are made by dropping a nanowire suspension onto a glass substrate placed atop a Teflon block.

Figure 9:
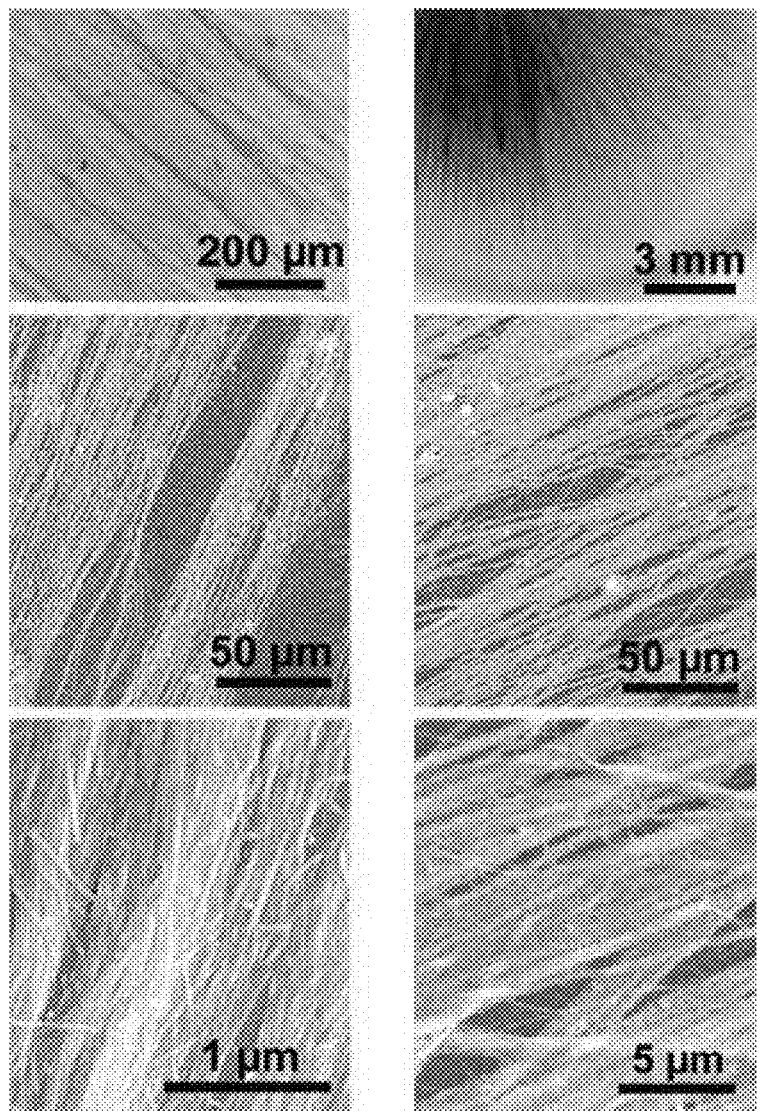
FIG. 9 shows an aligned CdSe nanowire film (top, at two different magnifications) and its corresponding SEM images (bottom two on left) under different magnifications and an aligned CdSe nanowire film produced by charging the center of a glass vial with its corresponding SEM images (bottom two on right) under different magnifications.
Figure 10:
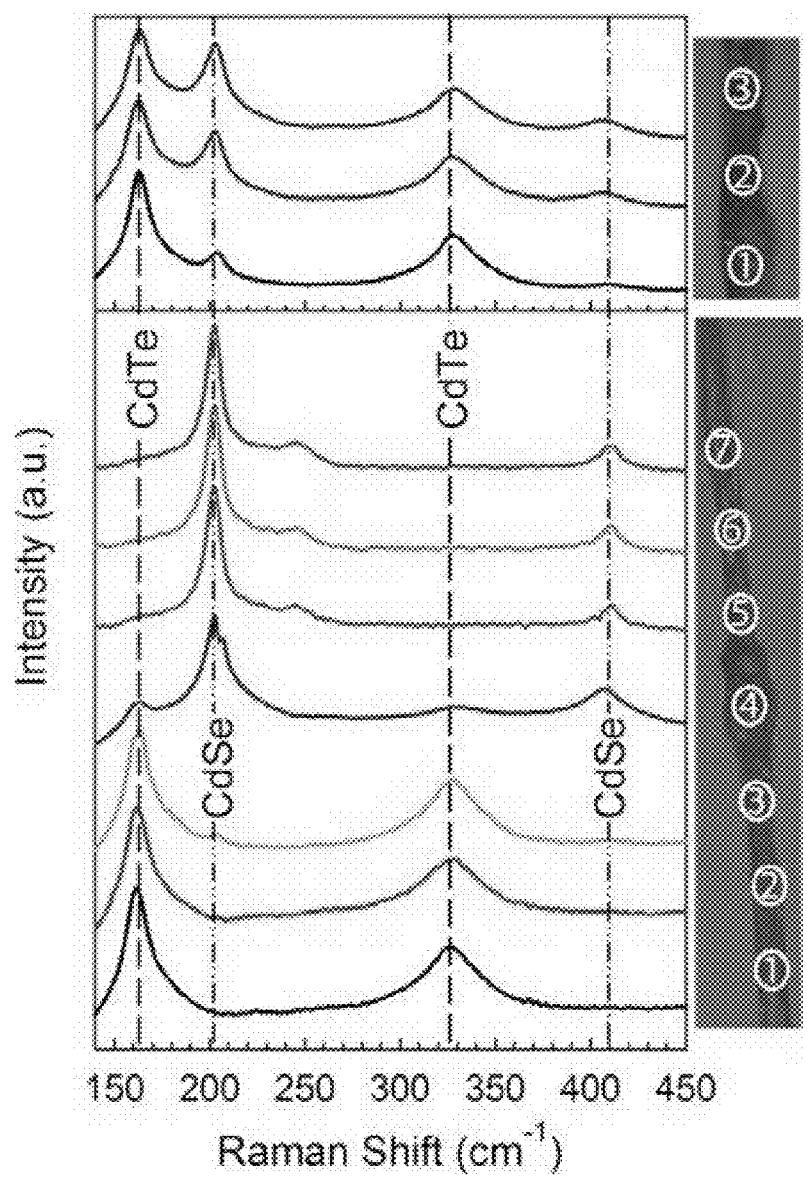
FIG. 10 shows Raman traces taken along a homogenously mixed CdSe/CdTe yarn (top) and Raman traces taken along various parts of a longitudinally segmented CdSe/CdTe yarn (bottom). Circled numbers denote where spectra were taken. Vertical lines also indicate CdSe's (203 cm$^{-1}$, 410 cm$^{-1}$; black dash-dot-dot lines) and CdTe's (163 cm$^{-1}$, 330 cm$^{-1}$; black dashed lines) longitudinal optimal (LO) phonon modes.

An electrostatic field is applied to the suspension by placing a (Van de Graaff) charged copper plate against one side of the Teflon block. This results in nanowire alignment in solution under ambient light illumination, which is retained once the solvent has evaporated. The electrostatic charge can be applied as a unipolar charge of either positive or negative sign. Alternatively, both positive and negative charges can be applied to opposite sides of a substrate to generate more uniform electric fields. Alignment areas on the order of 5-6 cm$^2$ have been achieved. Larger area alignment is also possible by changing the size of the substrate as well as the strength of the applied electrostatic field. In all cases, nanowire alignment occurs in registry with the applied electric field lines as shown in FIG. 9.

Example 12

Pyridine Treated Yarns

As made yarns can be post treated by dripping ~100 µL of pyridine over the yarns 4 to 5 times. The processed yarn is then left to dry under ambient conditions.

Example 13

Hydrazine Treated Yarns

As made yarns can be post treated with hydrazine. The entire processing is carried out inside a nitrogen filled glove box. A yarn is soaked in 1 M hydrazine (in acetonitrile) for 12 hours. The yarn is then removed and is allowed to dry for 8 hours. Once complete, the yarn is further dried under vacuum for ~10 hours.

Example 14

NaOH Treated Yarns

As-made yarns can be post treated with NaOH. A yarn is soaked in 1M NaOH (in methanol) for 10 minutes. It is then transferred to an evacuated oven at 100° C. and dried for 1 hour. When complete, the yarn is further rinsed with methanol inside a glove box and is left to dry for an additional ~10 hours.

Example 15

Butylamine Treated Yarns

As made yarns can be post treated with butylamine. A yarn is soaked in 1% butylamine in methanol (volume/volume) for 10 minutes. It is then transferred to an evacuated oven at 100° C. and is dried for 1 hour. When complete, the yarn is rinsed with methanol inside a glove box and is left to dry for an additional 10 hours.

While specific embodiments have been described above with reference to the disclosed embodiments and examples, such embodiments are only illustrative and do not limit the scope of the invention. Changes and modifications can be made in accordance with ordinary skill in the art without departing from the invention in its broader aspects as defined in the following claims.

All publications, patents, and patent documents are incorporated by reference herein, as though individually incorporated by reference. No limitations inconsistent with this disclosure are to be understood therefrom. The invention has been described with reference to various specific and preferred embodiments and techniques. However, it should be understood that many variations and modifications may be made while remaining within the spirit and scope of the invention.

What is claimed is:

1. A method for assembling semiconducting nanowires into yarns, said method comprising:
   providing a mixture, wherein the mixture comprises a dielectric solvent and at least two semiconducting nanowires;
   loading said mixture into a conduit;
   applying an electrostatic charge to a substrate;
   depositing said mixture from said conduit on top of said charged substrate under lighting conditions; and
   pulling said conduit away from said substrate in a direction along the surface normal.

2. The method according to claim 1, wherein the alignment area is from about 1 cm$^2$ to 100 square feet.

3. A method as set forth in claim 1, wherein said conduit is pulled away from said substrate in a direction along the surface normal at a rate of about 0.5 millimeters per second to about 50 mm/second.

4. A method as set forth in claim 1, wherein said conduit is a pipette or a syringe.

5. The method according to claim 1, wherein said electrostatic charge is selected from (1) a unipolar charge of a positive sign applied to said substrate; or (2) a unipolar charge of a negative sign applied to said substrate.

6. The method according to claim 1, wherein said nanowires are selected from zinc oxide, zinc sulfide, zinc selenide, zinc telluride, cadmium sulfide, cadmium selenide, cadmium telluride, mercury sulfide, mercury selenide, mercury telluride, germanium sulfide, germanium selenide, germanium telluride, tin sulfide, tin selenide, tin telluride, lead sulfide, lead selenide, lead telluride, and lead selenium sulfide, Si, Ge, GaP, GaAs, InP, InAs, or a combination thereof.

7. The method according to claim 1, wherein said substrate is selected from borosilicate, copper, or polytetrafluoroethylene, and wherein said dielectric solvent is selected from hexane, toluene, or a mixture thereof.

8. The method according to claim 1, wherein said substrate is charged by an electrostatic generator to deposit charges onto the substrate.

9. The method according to claim 1, wherein said nanowires are first washed to remove any excess ligand.

10. The method according to claim 1, wherein the source of said nanowires are nanowire solutions having concentrations from about 10$^{-12}$ to about 10$^{-11}$M.

11. The method according to claim 1, wherein said lighting conditions are broad band illumination.

12. The method according to claim 1, wherein said electrostatic charge ranges from about 10 V/cm to about 100 V/cm.

13. A method for assembling semiconducting nanowires into segmented yarns, said method comprising:
   providing more than one mixture, each more than one mixture comprising a dielectric solvent and at least two semiconducting nanowires;
   depositing more than one of said mixtures on top of a polytetrafluoroethylene substrate;
   applying an electrostatic charge to said substrate using a tissue or an electrostatic generator;
   introducing a conduit into one of said more than one mixture and then removing said conduit, wherein a first yarn of at least two semiconducting nanowires is formed;
   removing said conduit from said one of said more than one mixtures and placing the bottom of said first yarn of at least two semiconducting nanowires into a second of the other said more than one mixture, wherein at least one yarn of at least two semiconducting nanowires is formed, the method characterized by assembling nanowires using LINA (light induced nanowire assembly), the LINA comprising applying lighting conditions to said at least two semiconducting nanowires; wherein said at least two semiconducting nanowires alligate into said first yarn during the removing of said conduit from one of said more than one mixture and said placing of the bottom of said first yarn of at least two semiconducting nanowires into said second of the other said more than one mixture to form segmented yarns.

* * * * *